(12) United States Patent
Akiyama et al.

(10) Patent No.: US 12,259,655 B1
(45) Date of Patent: Mar. 25, 2025

(54) MANUFACTURING METHOD OF FLEXOGRAPHIC PRINTING PLATE AND PRINTING METHOD

(71) Applicant: ASAHI KASEI KABUSHIKI KAISHA, Tokyo (JP)

(72) Inventors: Hiroki Akiyama, Tokyo (JP); Akinao Nakamura, Tokyo (JP); Takumi Ishii, Tokyo (JP); Yusuke Shimizu, Tokyo (JP)

(73) Assignee: ASAHI KASEI KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 18/037,444

(22) PCT Filed: Mar. 3, 2023

(86) PCT No.: PCT/JP2023/008172
§ 371 (c)(1),
(2) Date: May 17, 2023

(87) PCT Pub. No.: WO2024/184980
PCT Pub. Date: Sep. 12, 2024

(51) Int. Cl.
*G03F 7/32* (2006.01)
*G03F 7/095* (2006.01)
*G03F 7/20* (2006.01)

(52) U.S. Cl.
CPC .............. *G03F 7/325* (2013.01); *G03F 7/095* (2013.01); *G03F 7/202* (2013.01)

(58) Field of Classification Search
CPC ........... G03F 7/325; G03F 7/095; G03F 7/202
USPC ................................................ 430/300, 393
See application file for complete search history.

(56) References Cited

U.S. PATENT DOCUMENTS

| | | |
|---|---|---|
| 2003/0129533 A1 | 7/2003 | Goodin et al. |
| 2004/0091824 A1 | 5/2004 | Bradford et al. |
| 2006/0177771 A1 | 8/2006 | Takagi et al. |
| 2009/0176176 A1 | 7/2009 | Araki et al. |
| 2012/0100489 A1* | 4/2012 | Hackler .................. G03F 7/32 430/493 |
| 2016/0004156 A1 | 1/2016 | Sugiyama et al. |
| 2018/0275515 A1 | 9/2018 | Saito et al. |
| 2020/0326627 A1 | 10/2020 | Jiang et al. |
| 2021/0200097 A1 | 7/2021 | Tsubaki et al. |
| 2021/0349394 A1 | 11/2021 | Ikeyama et al. |
| 2022/0043352 A1 | 2/2022 | Fujiki et al. |
| 2022/0082940 A1 | 3/2022 | Toyooka et al. |

FOREIGN PATENT DOCUMENTS

| | | |
|---|---|---|
| JP | 50-42902 | 4/1975 |
| JP | 11-265073 | 9/1998 |
| JP | 2007-519021 | 7/2007 |
| JP | 2012-88711 | 5/2012 |
| JP | 2018-116109 | 7/2018 |
| WO | 2011/025523 | 3/2011 |
| WO | 2017/057086 | 4/2017 |
| WO | 2017/057253 | 4/2017 |
| WO | 2020/122001 | 6/2020 |
| WO | 2020/158380 | 8/2020 |
| WO | 2020/175422 | 9/2020 |

OTHER PUBLICATIONS

International Search Report issued in International Application No. PCT/JP2023/008172, dated Apr. 11, 2023.
Written Opinion issued in International Application No. PCT/JP2023/008172, dated Apr. 11, 2023.
Japan, Notice of Reasons for Rejection issued in JP Application No. 2023-518121, dated Oct. 2, 2023.
Japan, Notice of Reasons for Rejection issued in JP Application No. 2023-518121, dated Jun. 9, 2023.
Japan, Decision to Grant a Patent issued in JP Application No. 2023-518121, dated Jan. 18, 2024.
Supplementary European Search Report for EP Application No. 23722480.3, dated Feb. 5, 2024.

* cited by examiner

*Primary Examiner* — Caleen O Sullivan
(74) *Attorney, Agent, or Firm* — GREENBLUM & BERNSTEIN, P.L.C.

(57) ABSTRACT

Provided is a manufacturing method of a flexographic printing plate, including a development step of subjecting a plate surface of a flexographic printing original plate including at least a support, a photosensitive resin composition layer, and an infrared ablation layer sequentially stacked to brushing with a brush while supplying an organic solvent-based developer to the plate surface, wherein the organic solvent-based developer includes 0.1% by mass or more and 10.0% by mass or less of a polymer gel.

8 Claims, No Drawings

MANUFACTURING METHOD OF FLEXOGRAPHIC PRINTING PLATE AND PRINTING METHOD

TECHNICAL FIELD

The present invention relates to a manufacturing method of a flexographic printing plate and a printing method.

BACKGROUND ART

Flexographic printing is one type of letterpress printing and is advantageously applicable to various printing objects as soft materials such as rubber and synthetic resin are used as materials for flexographic printing plates.

A method in which plate making is carried out using a negative film and a method involving use of computer to plate technology (hereinafter, referred to as CTP technology) in which information processed on a computer is directly drawn on a printing plate to produce relief are conventionally known as a manufacturing method of a flexographic printing plate used for flexographic printing.

In the method using the CTP technology described above, a step of manufacturing a negative film is not needed, and material costs and time required to manufacture a negative film are thus reduced. Therefore, the method involving use of CTP technology has become mainstream recently as a manufacturing method of a flexographic printing plate.

When CTP technology is used, a original plate having at least a photosensitive resin composition layer and an infrared ablation layer sequentially stacked on a support of PET (polyethylene terephthalate) or the like is usually used as a original plate of a flexographic printing plate (hereinafter, sometimes referred to as a "flexographic printing original plate").

Manufacturing of a flexographic printing plate using CTP technology is carried out in the following manner, for example.

Firstly, a uniform cured layer is formed by performing back exposure in which the entire surface of a photosensitive resin composition layer is irradiated with ultraviolet light through a support of PET or the like that constitutes the flexographic printing original plate. Then, lithography is performed by irradiating, with a laser, an infrared ablation layer on the photosensitive resin composition layer to remove a part of the infrared ablation layer, thereby producing an image mask. Furthermore, relief exposure in which the photosensitive resin composition layer is irradiated with ultraviolet light through the image mask is performed to photocure the photosensitive resin composition at the part at which the infrared ablation layer has been removed. Thereafter, a development step of removing the unexposed part, that is, the part not photocured, of the photosensitive resin composition layer is carried out to form a relief image, which is a desired image, and a flexographic printing plate is thus obtained.

For the development step mentioned above, a solvent development scheme in which a photosensitive resin composition at an unexposed part is dissolved using an organic solvent-based developer, and a water development scheme in which a photosensitive resin composition at an unexposed part is swollen and peeled using water containing a surfactant have been proposed. In particular, the solvent development scheme has a fast developing rate and is widely used.

For example, Patent Literature 1 discloses a technique of stabilizing developing performance by keeping the temperature of a developer in a given range.

Patent Literature 2 discloses a developer that maintains a developing rate and development quality with its odor suppressed.

CITATION LIST

Patent Literature

Patent Literature 1: Japanese Patent Laid-Open No. 2018-116109
Patent Literature 2: International Publication No. WO 2011/025523

SUMMARY OF INVENTION

Technical Problem

A problem of the previously proposed techniques mentioned above, however, is that these techniques are still susceptible to improvement because the dimensional accuracy of a flexographic printing plate linked directly to printing performance is not discussed.

Therefore, giving consideration to the problem of the conventional techniques mentioned above, the present invention aims at providing a manufacturing method of a flexographic printing plate which produces a flexographic printing plate excellent in dimensional stability and excellent in printing characteristics while maintaining a fast developing rate and enhancing the productivity of a development step.

Solution to Problem

The present inventors have made intensive studies to solve the above-described problems, and as a result, found that the problem of the conventional technique mentioned above can be solved by performing a development step of subjecting the plate surface of a flexographic printing original plate to brushing with a brush while supplying a predetermined organic solvent-based developer to the plate surface; thus, the present invention has been accomplished.

Specifically, the present invention is as follows.

[1]
A manufacturing method of a flexographic printing plate, comprising a development step of subjecting a plate surface of a flexographic printing original plate comprising at least a support, a photosensitive resin composition layer, and an infrared ablation layer sequentially stacked to brushing with a brush while supplying an organic solvent-based developer to the plate surface, wherein
the organic solvent-based developer comprises 0.1% by mass or more and 10.0% by mass or less of a polymer gel.

[2]
The manufacturing method of the flexographic printing plate according to [1] above, wherein
an absolute value of difference between a solubility parameter (SP value) of the organic solvent and a solubility parameter (SP value) of the polymer gel in the organic solvent-based developer is
0.5 $(cal/cm^3)^{1/2}$ or more and 4.0 $(cal/cm^3)^{1/2}$ or less.

[3]
The manufacturing method of the flexographic printing plate according to [1] or [2] above, wherein
the polymer gel is a particle having a number average particle diameter of 40 nm or more and 400 nm or less.

[4]
The manufacturing method of the flexographic printing plate according to any one of [1] to [3] above, wherein
the photosensitive resin composition layer comprises a thermoplastic elastomer.

[5]
The manufacturing method of the flexographic printing plate according to any one of [1] to [4] above, wherein
the photosensitive resin composition layer comprises a thermoplastic elastomer and a polymer particle.

[6]
The manufacturing method of the flexographic printing plate according to [5] above, wherein
the photosensitive resin composition layer has a dispersed phase and a continuous phase, and
the thermoplastic elastomer and the polymer particle form the continuous phase and the dispersed phase, respectively.

[7]
The manufacturing method of the flexographic printing plate according to [5] or [6] above, wherein
an absolute value of difference between a solubility parameter (SP value) of the thermoplastic elastomer and a solubility parameter (SP value) of the polymer particle is
0.1 $(cal/cm^3)^{1/2}$ or more and 2.0 $(cal/cm^3)^{1/2}$ or less.

[8]
The manufacturing method of the flexographic printing plate according to any one of [1] to [7] above, wherein
the organic solvent-based developer comprises
one or more selected from the group consisting of fatty acid esters, hydrocarbons, and chlorine-based organic solvents, and an alcohol.

[9]
A printing method comprising:
a step of obtaining a flexographic printing plate by the manufacturing method of the flexographic printing plate according to any one of [1] to [8] above, and
a step of performing printing using the flexographic printing plate.

Advantageous Effects of Invention

According to the present invention, there can be provided a manufacturing method of a flexographic printing plate which achieves a fast developing rate and an enhanced productivity in the development step and produces a flexographic printing plate excellent in dimensional stability and printing characteristics.

DESCRIPTION OF EMBODIMENTS

Hereinafter, an embodiment of the present invention (hereinafter, referred to as the "present embodiment") will be described in detail. However, the present embodiment is an illustration for describing the present invention and does not intend to limit the present invention by the contents given below.

The present invention can be carried out by appropriately making modifications without departing from the spirit of the present invention.

[Manufacturing Method of Flexographic Printing Plate]

The manufacturing method of a flexographic printing plate of the present embodiment comprises a development step of subjecting a plate surface of a flexographic printing original plate comprising at least a support, a photosensitive resin composition layer, and an infrared ablation layer sequentially stacked to brushing with a brush while supplying an organic solvent-based developer to the plate surface.

The organic solvent-based developer contains 0.1% by mass or more and 10.0% by mass or less of a polymer gel.

The manufacturing method of a flexographic printing plate of the present embodiment produces a flexographic printing plate excellent in dimensional stability and printing characteristics while maintaining a fast developing rate and enhancing the productivity of the development step.

For example, the manufacturing method of a flexographic printing plate of the present embodiment may include a back exposure step of irradiating the flexographic printing original plate with ultraviolet light from the support side; an infrared irradiation step of irradiating the infrared ablation layer with infrared light to carry out lithography processing of a pattern; a relief exposure step of irradiating the photosensitive resin composition layer with ultraviolet light using the infrared ablation layer that has undergone the lithography processing of a pattern as a mask to carry out relief exposure; and a development step of removing the infrared ablation layer and the unexposed part of the photosensitive resin composition layer.

Hereinafter, each step will be described in detail.

(Back Exposure Step)

Firstly, in the back exposure step, the entire surface of the photosensitive resin composition layer is subjected to ultraviolet light exposure (back exposure) through the support of the flexographic printing original plate and cured to form a thin uniform cured layer (back surface). The cured layer (back surface) serves as a part that is included in the cured photosensitive resin composition layer to be formed in the relief exposure step.

In this respect, the exposure method is not particularly limited and can be performed using a known irradiation unit.

Examples of a light source of the ultraviolet light include, but not limited to, a low pressure mercury lamp, a high pressure mercury lamp, an ultrahigh pressure mercury lamp, a metal halide lamp, a xenon lamp, a zirconium lamp, a carbon arc lamp, and a fluorescent lamp for ultraviolet light.

The back exposure step may be performed before the infrared irradiation step mentioned later, or the back exposure step and the relief exposure step mentioned later may be simultaneously performed.

(Infrared Irradiation Step)

In the infrared irradiation step, a negative pattern is created on the infrared ablation layer on the photosensitive resin composition layer by laser lithography (i.e., laser ablation). When the flexographic printing original plate has a cover film on the infrared ablation layer, the cover film is first peeled before infrared irradiation. Thereafter, the infrared ablation layer is subjected to pattern irradiation with infrared light, and the resin at the infrared irradiated part is decomposed to perform lithography processing of a pattern. A mask of the infrared ablation layer is thus formed on the photosensitive resin composition layer.

An infrared laser can be used for laser lithography, and a laser with a wavelength of 750 to 2000 nm is preferable as the infrared laser. A semiconductor laser with a wavelength of 750 to 880 nm and Nd-YAG laser with a wavelength of 1060 nm are generally used as the infrared laser satisfying the wavelength range.

(Relief Exposure Step)

In the relief exposure step, image exposure (relief exposure) is conducted on the photosensitive resin composition layer by ultraviolet irradiation using, as a mask, the infrared ablation layer in which the negative pattern is formed, to form a cured photosensitive resin composition layer. When an intermediate layer mentioned later is present between the photosensitive resin composition layer and the infrared ablation layer, relief exposure is conducted on the photosensitive resin composition layer via the intermediate layer.

In this respect, light that has passed through the mask accelerates the curing reaction of the photosensitive resin composition layer so that projections and depressions of the pattern formed in the infrared ablation layer are transferred in an inverted manner to the photosensitive resin composition layer. The ultraviolet irradiation may be performed on the entire surface of the flexographic printing original plate.

Either exposure from the infrared ablation layer side (relief exposure) or exposure from the support film side (back exposure) may be conducted first, or both may be simultaneously conducted.

Examples of an exposure light source include a high pressure mercury lamp, an ultraviolet fluorescent lamp, a carbon arc lamp, and a xenon lamp.

(Development Step)

In the development step, the infrared ablation layer and the unexposed part of the photosensitive resin composition layer are removed.

When the intermediate layer is present, the intermediate layer is also removed together therewith.

In the development step in the manufacturing method of a flexographic printing plate of the present embodiment, the plate surface of the flexographic printing original plate is subjected to brushing with a brush while an organic solvent-based developer is supplied to the plate surface. Examples of the brushing with a brush include, but not limited to, brushing that is performed by rotation with a roll brush or plane rotation or reciprocal motion with a flat brush.

<Organic Solvent-Based Developer>

The organic solvent-based developer for use in the development step refers to a developer containing an organic solvent.

Examples of the organic solvent include, but not limited to, various organic solvents including chlorine-based organic solvents such as 1,1,1-trichloroethane and tetrachloroethylene; ester solvents such as heptyl acetate and 3-methoxybutyl acetate; and hydrocarbon solvents such as a petroleum fraction, toluene, and decalin.

The organic solvent-based developer for use in the development step preferably contains one or more selected from the group consisting of a fatty acid ester, a hydrocarbon, and a chlorine-based organic solvent as an organic solvent and preferably further contains an alcohol as an organic solvent, in view of dissolving or swelling various raw materials contained in the flexographic printing original plate, and facilitating development.

Mixtures of alcohols such as 1-propanol, 2-propanol, 1-butanol, 2-butanol, 1-pentanol, 2-pentanol, 3-pentanol, and benzyl alcohol contained in various organic solvents of the fatty acid ester, the hydrocarbon, or the chlorine-based organic solvent are preferably used as the organic solvent-based developer for use in the development step.

Specifically, "Cylosol" (manufactured by DuPont Specialty Products K.K., trade name), "SOLVIT" (manufactured by MacDermid Performance Solutions Japan K.K., trade name), or the like can be used.

The content of the organic solvent mentioned above in the whole organic solvent-based developer is preferably 50% by mass or more, more preferably 65% by mass or more, and still more preferably 80% by mass or more in view of a developing rate.

[Polymer Gel in Organic Solvent-Based Developer]

The organic solvent-based developer for use in the manufacturing method of a flexographic printing plate of the present embodiment contains 0.1% by mass or more and 10% by mass or less of a polymer gel based on the total amount of the organic solvent-based developer in view of ensuring a fast developing rate, and obtaining high dimensional accuracy of a flexographic printing plate.

The content of the polymer gel is preferably 0.5% by mass or more and more preferably 0.7% by mass or more. The content of the polymer gel is preferably 5.0% by mass or less and more preferably 3.0% by mass or less.

A polymer mentioned later is preferably used as the polymer gel.

The polymer gel used in the present embodiment is present in a state dispersed in the organic solvent-based developer without being dissolved in the organic solvent-based developer. This enables both an improved developing rate and high dimensional accuracy to be achieved. This is because the polymer gel works as abrasive grains at the time of development and enhances a developing rate while the organic solvent-based developer incorporated inside the polymer gel decreases the hardness of the polymer gel and can achieve high dimensional accuracy without damaging plate surface.

A measure of the insolubility of the polymer gel in the organic solvent-based developer includes a toluene gel fraction. The polymer gel used in the present embodiment has a toluene gel fraction of preferably 50% or more and 100% or less. The toluene gel fraction is more preferably 60% or more and 100% or less and still more preferably 85% or more and 100% or less.

The toluene gel fraction of the polymer gel herein is determined as follows.

0.5 g of the polymer gel is taken and immersed in 30 mL of toluene at 25° C. followed by shaking for three hours using a shaking device. The resultant is subsequently filtered with a 320 SUS mesh, and the matter not passing through the mesh is dried at 130° C. for one hour. The mass of this dried component is divided by 0.5 (g), and the resulting mass fraction (%) was regarded as the toluene gel fraction.

The polymer gel in the organic solvent-based developer can be taken out by adding methanol to the organic solvent developer to precipitate resin matter, and drying the supernatant.

The toluene gel fraction of the polymer gel can be controlled by a known method. The toluene gel fraction can be controlled to the numeric range described above, for example, by adjusting the amount of a chain transfer agent for use in the synthesis of the polymer gel.

Examples of a manufacturing method of the polymer gel include a method involving synthesizing the polymer gel by various polymerization methods such as suspension polymerization or emulsion polymerization, and a method involving manufacturing the polymer gel using mechanochemical.

Examples of the polymer that constitutes the polymer gel include, but not limited to, polymers having a butadiene skeleton, such as polybutadiene, an acrylonitrile-butadiene copolymer, a styrene-butadiene copolymer, and a (meth)acrylate-butadiene copolymer; polymers having an isoprene skeleton, such as polyisoprene and polychloroprene; polymers in which the polymer having a butadiene skeleton or an isoprene skeleton is further polymerized with a monomer having a carboxyl group and/or a hydroxy group; polymers in which the polymer having a butadiene skeleton or an isoprene skeleton is further polymerized with a (meth)acrylic acid ester; polymers in which the polymer having a butadiene skeleton or an isoprene skeleton is further polymerized with (meth)acrylic acid ester and a monomer having a carboxyl group and/or a hydroxy group; and polyurethane, a vinylpyridine polymer, a butyl polymer, a Thiokol polymer, an acrylate polymer, and natural rubber.

The polymer gel used in the present embodiment is preferably particles having a number average particle diameter of 40 nm or more and 200 nm or less. The number average particle diameter is more preferably 50 nm or more and 180 nm or less and still more preferably 60 nm or more and 170 nm or less.

The number average particle diameter of the polymer gel is preferably 40 nm or more in view of maintaining a fast developing rate and is preferably 200 nm or less in view of manufacturing a flexographic printing plate excellent in reproducibility.

The number average particle diameter of the polymer gel in the organic solvent-based developer can be measured with a dynamic light scattering apparatus and can be controlled to the numeric range described above by appropriately setting a synthesis temperature and synthesis time of the polymer gel.

[Solubility Parameters of Organic Solvent and Polymer Gel in Organic Solvent-Based Developer]

The solubility parameter (SP value) of the organic solvent in the organic solvent-based developer used in the present embodiment is preferably 8.0 $(cal/cm^3)^{1/2}$ or more and 11.0 $(cal/cm^3)^{1/2}$ or less, more preferably 8.5 $(cal/cm^3)^{1/2}$ or more and 10.0 $(cal/cm^3)^{1/2}$ or less, and still more preferably 8.8 $(cal/cm^3)^{1/2}$ or more and 9.5 $(cal/cm^3)^{1/2}$ or less in view of obtaining a fast developing rate.

The solubility parameter (SP value) of the polymer gel in the organic solvent-based developer is preferably 8.0 $(cal/cm^3)^{1/2}$ or more and 11.0 $(cal/cm^3)^{1/2}$ or less, more preferably 8.5 $(cal/cm^3)^{1/2}$ or more and 10.0 $(cal/cm^3)^{1/2}$ or less, still more preferably 8.8 $(cal/cm^3)^{1/2}$ or more and 9.5 $(cal/cm^3)^{1/2}$ or less in view of obtaining a fast developing rate.

The absolute value of difference between the solubility parameter (SP value) of the organic solvent and the solubility parameter (SP value) of the polymer gel in the organic solvent-based developer used in the present embodiment is preferably 0.5 $(cal/cm^3)^{1/2}$ or more and 4.0 $(cal/cm^3)^{1/2}$ or less, more preferably 0.6 $(cal/cm^3)^{1/2}$ or more and 3.0 $(cal/cm^3)^{1/2}$ or less, and still more preferably 0.7 $(cal/cm^3)^{1/2}$ or more and 2.0 $(cal/cm^3)^{1/2}$ or less in view of obtaining a flexographic printing plate excellent in dimensional stability, and ensuring a fast developing rate, and further the dispersibility of the polymer gel in the organic solvent-based developer.

The solubility parameter (SP value) of the organic solvent and polymer gel in the organic solvent-based developer for use in the manufacturing method of a flexographic printing plate of the present embodiment is defined according to the following expression (1):

$$SP\ value(\delta)=(\Delta E/V)^{1/2}[(cal/cm^3)^{1/2}] \quad (1)$$

wherein V represents a molar volume of the molecule of the solvent, and $\Delta E$ represents cohesive energy (evaporation energy).

The molar volume of the molecule and the cohesive energy of the organic solvent may be determined from a known value as described in, for example, the literature "POLYMER ENGINEERING AND SCIENCE, Vol. 14, 147-154, 1974".

On the other hand, the parameter, when unknown, may be actually measured by use of an approach called cloud-point titration method.

Specifically, first, a sample having an unknown SP value is dissolved in a good solvent having a known SP value, and a poor solvent having a lower SP value than that of the good solvent is added dropwise to the solution. The volume of the poor solvent in which the solute has started to be deposited is measured. Subsequently, a newly prepared sample having an unknown SP value is dissolved in a good solvent having a known SP value, and a poor solvent having a higher SP value than that of the good solvent is added dropwise to the solution. The volume of the poor solvent in which the solute has started to be deposited is measured. The SP value ($\delta$) can be determined by applying the respective volumes of the poor solvents determined here to the following expression (2):

$$SP\ value(\delta)=(V_{m1}^{1/2}\cdot\delta_{m1}+V_{mh}^{1/2}\cdot\delta_{mh})/(V_{m1}^{1/2}+V_{mh}^{1/2}) \quad (2)$$

wherein $V_{m1}$ represents the volume of the poor solvent having a lower SP value, $V_{mh}$ represents the volume of the poor solvent having a higher SP value, $\delta_{m1}$ represents the SP value of the poor solvent having a lower SP value, and $\delta_{mh}$ represents the SP value of the poor solvent having a higher SP value.

All SP values mentioned in Examples described later were values actually found by the cloud-point titration method.

The absolute value of difference between the solubility parameter (SP value) of the organic solvent and the solubility parameter (SP value) of the polymer gel in the organic solvent-based developer can be controlled to the numeric range mentioned above by selecting an organic solvent and a polymer gel each having an appropriate solubility parameter in combination.

(Post Treatment Step)

After the development step mentioned above, post treatment exposure is conducted, if necessary, to obtain a flexographic printing plate.

As the post treatment exposure, a method involving irradiating the surface with light having a wavelength of 300 nm or less is exemplified. Light having a wavelength of more than 300 nm may be used in combination as needed.

(Flexographic Printing Original Plate)

In the manufacturing method of a flexographic printing plate of the present embodiment, a flexographic printing original plate comprising at least a support, a photosensitive resin composition layer, and an infrared ablation layer sequentially stacked is used.

An intermediate layer or a functional layer such as an adhesive layer may be provided, if necessary, between these layers.

Hereinafter, the configuration of the flexographic printing original plate used in the present embodiment will be described.

<Support>

Examples of the support that constitutes the flexographic printing original plate include, but not limited to, a polypropylene film, a polyethylene film, a film of a polyester such as polyethylene terephthalate and polyethylene naphthalate, and a polyamide film.

Among them, a polyester film is preferable as the support.

The thickness of the support is preferably 75 μm or more and 300 μm or less. The thickness is preferably 75 μm or more in view of the strength of the flexographic printing original plate and is preferably 300 μm or less in view of flexibility.

An adhesive layer may be provided between the support and the photosensitive resin composition layer mentioned later for the purpose of enhancing adhesive strength between these layers.

Examples of material for the adhesive layer include, but not limited to, a composition having a binder polymer such as polyurethane, polyamide, and a thermoplastic elastomer and an adhesive active ingredient such as an isocyanate compound and an ethylenically unsaturated compound. Furthermore, various auxiliary additive components such as a plasticizer, a thermal-polymerization preventing agent, an ultraviolet absorber, a halation preventing agent, a photostabilizer, a photopolymerization initiator, a photopolymerizable monomer, and a dye may be added to the adhesive layer.

At least one or more undercoating layers may be provided between the adhesive layer and the support for the purpose of further enhancing adhesive strength between the adhesive layer and the support.

<Photosensitive Resin Composition Layer>

The flexographic printing original plate for use in the manufacturing method of a flexographic printing plate of the present embodiment has a photosensitive resin composition layer on the support.

The photosensitive resin composition layer that constitutes the flexographic printing original plate preferably contains, for example, a thermoplastic elastomer (a-1), polymer particles (a-2), a photopolymerizable monomer (a-3), and a photopolymerization initiator (a-4).

The photosensitive resin composition layer may optionally contain liquid diene (a-5), a silicone compound (a-6), and the like in addition to each of the components.

The photosensitive resin composition layer can have a configuration having a dispersed phase and a continuous phase. It is preferable that the thermoplastic elastomer (a-1) and the polymer particles (a-2) undergo phase separation in view of obtaining a fast developing rate. Either the thermoplastic elastomer (a-1) or the polymer particles (a-2) may be the continuous phase or the dispersed phase. It is preferable that the thermoplastic elastomer (a-1) and the polymer particles (a-2) be the continuous phase and the dispersed phase, respectively.

Hereinafter, these components will be described in detail. Components described in, for example, "Japanese Patent Laid-Open No. 2018-120131" may be used as these components.

As a method for confirming phase separation, for example, hardness information is obtained using an atomic force microscope (AFM), and a distribution of the hardness can be obtained for measurement.

[Thermoplastic Elastomer (a-1)]

Examples of the thermoplastic elastomer (a-1) include, but not limited to, a thermoplastic elastomer having a constituent unit derived from a conjugated diene and/or a vinyl aromatic compound.

The thermoplastic elastomer (a-1) may be a homopolymer or a copolymer. In the case of being a copolymer, the thermoplastic elastomer (a-1) may be a random polymer or a block polymer.

Among them, the thermoplastic elastomer (a-1) is preferably a thermoplastic elastomer containing at least one polymer block mainly including a conjugated diene monomer unit and at least one polymer block mainly including a vinyl aromatic monomer unit.

The term "mainly including" used herein means that 60% by mass or more of the polymer block is constituted by a predetermined monomer.

When the thermoplastic elastomer (a-1) has a polymer block mainly including a conjugated diene monomer unit, the content of the conjugated diene monomer unit in this polymer block mainly including a conjugated diene monomer unit is preferably 80% by mass or more and more preferably 90% by mass or more of the polymer block.

Examples of the conjugated diene include, but not limited to, 1,3-butadiene, isoprene, 2,3-dimethyl-1,3-butadiene, 2-methyl-1,3-pentadiene, 1,3-hexadiene, 4,5-diethyl-1,3-octadiene, 3-butyl-1,3-octadiene, and chloroprene. Among them, 1,3-butadiene is especially preferable in view of the abrasion resistance of the photosensitive resin composition layer.

These monomers may be used singly or in combinations of two or more thereof.

A vinyl bond content in the polymer block mainly including a conjugated diene monomer unit is preferably 5 mol % or more and 50 mol % or less, more preferably 8 mol % or more and 50 mol % or less, and still more preferably 10 mol % or more and 40 mol % or less based on the total amount of the conjugated diene monomer unit in view of flexographic printing plate formability. The "vinyl bond content" herein refers to a 1,2-vinyl bond content and a 3,4-vinyl bond content.

The number average molecular weight of the polymer block mainly including a conjugated diene monomer unit is preferably 20,000 or more and 250,000 or less, more preferably 30,000 or more and 200,000 or less, and still more preferably 40,000 or more and 150,000 or less in view of the wear resistance of the flexographic printing plate.

The polymer block mainly including a conjugated diene monomer unit may contain an alkylene unit. An introducing method of the alkylene unit is not particularly limited, and examples thereof include a method involving polymerization using a monoolefin such as ethylene and butylene as a raw material monomer of the polymer block including mainly of the conjugated diene, and a method involving hydrogenating conjugated diene polymer block. Especially, a method involving hydrogenating the polymer block mainly including a conjugated diene monomer unit is preferable in view of availability.

The content of the alkylene unit in the polymer block mainly including a conjugated diene monomer unit is preferably 5 mol % or more and 50 mol % or less, more preferably 10 mol % or more and 35 mol % or less, and still more preferably 10 mol % or more and 25 mol % or less based on the total amount of the monomer unit that constitutes the polymer block mainly including a conjugated diene monomer unit. When the content of the alkylene unit is 5 mol % or more, the solvent resistance of the flexographic printing plate tends to be more improved. When the content of the alkylene unit is 50 mol % or less, the transparency of the photosensitive resin composition layer tends to be more improved.

The polymer block mainly including a conjugated diene monomer unit preferably contains the alkylene unit and more preferably contains all of a 1,4-butadiene unit, a 1,2-butadiene (vinyl) unit, and a butylene (alkylene) unit, in view of the solvent resistance of the flexographic printing plate. In this respect, the polymer block mainly including a conjugated diene monomer unit still more preferably contains 25 mol % or more and 70 mol % or less of the 1,4-butadiene unit, 0 mol % or more and 50 mol % or less of the 1,2-butadiene (vinyl) unit, and 10 mol % or more and 50 mol % or less of the butylene unit. Such a polymer block is obtained by hydrogenating the polymer block moiety mainly including butadiene.

The thermoplastic elastomer (a-1), the content and ratio of the conjugated diene monomer unit in the polymer block mainly including a conjugated diene monomer unit, the vinyl bond content of the conjugated diene, and the content and ratio of the vinyl aromatic monomer unit can be measured using a nuclear magnetic resonance device ($^1$H-NMR).

Examples of the vinyl aromatic compound include, but not limited to, monomers such as styrene, t-butylstyrene, divinylbenzene, 1,1-diphenylstyrene, N, N-dimethyl-p-aminoethylstyrene, N, N-diethyl-p-aminoethylstyrene, vinylpyridine, p-methylstyrene, tertiary butylstyrene, α-methylstyrene, and 1,1-diphenylethylene. Styrene is especially preferable because a flexographic printing original plate with smoothness can be formed at a relatively low temperature (hereinafter, referred to as high smoothness).

These monomers may be used singly, or in combinations of two or more thereof.

The number average molecular weight of the polymer block mainly including a vinyl aromatic monomer unit that constitutes the thermoplastic elastomer (a-1) is preferably 100,000 or less in view of preventing orientation of a flexographic printing plate from being exhibited and is preferably 3,000 or more in view of chipping resistance during plate making and printing. The number average molecular weight of the polymer block mainly including a vinyl aromatic monomer unit is more preferably 5,000 or more and 80,000 or less and still more preferably 5,000 or more and 60,000 or less.

The content of the vinyl aromatic monomer unit in the thermoplastic elastomer (a-1) is preferably 13% by mass or more and 25% by mass or less, more preferably 15% by mass or more and 24% by mass or less, and still more preferably 16% by mass or more and 23% by mass or less based on the total amount of the block copolymer.

When the content of the vinyl aromatic monomer unit is 25% by mass or less, high smoothness of the photosensitive resin composition, high chipping resistance at a convex part of the flexographic printing plate, and keeping hardness of the printing plate high when an ink component attaches thereto tend to be achieved. On the other hand, when the content of the vinyl aromatic monomer unit is 13% by mass or more, the cold flow resistance of the flexographic printing original plate tends to be more improved.

The solubility parameter (SP value) of the thermoplastic elastomer (a-1) used for the photosensitive resin composition layer is preferably 8.0 $(cal/cm^3)^{1/2}$ or more and 11.0 $(cal/cm^3)^{1/2}$ or less, more preferably 8.5 $(cal/cm^3)^{1/2}$ or more and 10.0 $(cal/cm^3)^{1/2}$ or less, and still more preferably 8.8 $(cal/cm^3)^{1/2}$ or more and 9.5 $(cal/cm^3)^{1/2}$ or less in view of obtaining a fast developing rate.

The solubility parameter (SP value) of the thermoplastic elastomer (a-1) can be measured by the method described in the section [Solubility parameters of organic solvent and polymer gel in organic solvent-based developer].

The absolute value of difference between the solubility parameter (SP value) of the thermoplastic elastomer (a-1) and the solubility parameter (SP value) of the polymer particles (a-2) used for the photosensitive resin composition is preferably 0.1 $(cal/cm^3)^{1/2}$ or more and 2 $(cal/cm^3)^{1/2}$ or less, more preferably 0.2 $(cal/cm^3)^{1/2}$ or more and 1 $(cal/cm^3)^{1/2}$ or less, and still more preferably 0.3 $(cal/cm^3)^{1/2}$ or more and 0.8 $(cal/cm^3)^{1/2}$ or less in view of obtaining a flexographic printing plate having excellent image reproducibility and high printing quality.

The absolute value of difference between the solubility parameter (SP value) of the thermoplastic elastomer (a-1) and the solubility parameter (SP value) of the polymer particles (a-2) can be controlled to the numeric range mentioned above by selecting a thermoplastic elastomer and polymer particles having an appropriate solubility parameter in combination.

The content of the thermoplastic elastomer (a-1) in the photosensitive resin composition layer that constitutes the flexographic printing original plate is preferably 15% by mass or more and 90% by mass or less, more preferably 15% by mass or more and 80% by mass or less, and still more preferably 20% by mass or more and 75% by mass or less based on 100% by mass of the total amount of the photosensitive resin composition layer in view of wear resistance during printing.

[Polymer Particle (a-2)]

The photosensitive resin composition layer of the flexographic printing original plate for use in the manufacturing method of a flexographic printing plate of the present embodiment preferably contains a polymer particle (a-2).

The polymer particle (a-2) is a particle of an internally-crosslinked polymer formed from a monomer. The polymer particle (a-2) is obtained by, but not limited to, preparing a compound containing a gel in which polymer particles as a dispersoid are dispersed in water by emulsion polymerization, and removing water from the obtained compound containing a gel.

The polymer particles (a-2) may be the same with or different from the polymer gel contained in the organic solvent-based developer mentioned above, and is preferably the same therewith because the concentration of the polymer gel in the organic solvent-based developer is kept constant to thereby result in more stable development quality.

Examples of a manufacturing method of the polymer particles (a-2) include a method involving synthesizing the polymer particles by various polymerization technique such as suspension polymerization or emulsion polymerization, and a method of manufacturing the polymer particles using mechanochemical.

Examples of the polymer that constitutes the polymer particles (a-2) include, but not limited to, polymers having a butadiene skeleton, such as polybutadiene, an acrylonitrile-butadiene copolymer, a styrene-butadiene copolymer, and a (meth)acrylate-butadiene copolymer; polymers having an isoprene skeleton, such as polyisoprene and polychloroprene; polymers in which the polymer having a butadiene skeleton or an isoprene skeleton is further polymerized with a monomer having a carboxyl group and/or a hydroxy group; polymers in which the polymer having a butadiene skeleton or an isoprene skeleton is further polymerized with a (meth)acrylic acid ester; polymers in which the polymer having a butadiene skeleton or an isoprene skeleton is further polymerized with (meth)acrylic acid ester and a monomer having a carboxyl group and/or a hydroxy group; and polyurethane, a vinylpyridine polymer, a butyl polymer, a Thiokol polymer, an acrylate polymer, and natural rubber.

The number average particle diameter of the polymer particles (a-2) contained in the photosensitive resin composition layer is preferably 500 nm or less and more preferably 100 nm or less. When the number average particle diameter is 500 nm or less, the developing performance of the flexographic printing original plate tends to be more improved.

The toluene gel fraction of the polymer particles (a-2) is preferably 50% or more and 100% or less. The toluene gel fraction is more preferably 60% or more and 100% or less and still more preferably 85% or more and 100% or less.

When the toluene gel fraction is 50% or more, practically sufficient strength tends to be imparted to a flexographic printing plate. When the toluene gel fraction is 100% or less, mixing properties between the polymer particles (a-2) and the thermoplastic elastomer (a-1) tend to be good.

The toluene gel fraction herein is determined as follows.

An appropriate amount of a dispersion containing about 30% by mass of the polymer particles (a-2) is dropped on a Teflon (R) sheet followed by drying at 130° C. for 30 minutes, and 0.5 g of the polymer particles (a-2) is taken therefrom. This is immersed in 30 mL of toluene at 25° C. followed by shaking for three hours using a shaking device. The resultant is subsequently filtered with a 320 SUS mesh, and the matter not passing through the mesh is dried at 130° C. for one hour. The mass of this dried component is divided by 0.5 (g), and the resulting mass fraction (%) was regarded as the toluene gel fraction.

The toluene gel fraction of the polymer particles (a-2) can be controlled by a known method. The toluene gel fraction can be controlled to the numeric range described above, for example, by adjusting the amount of a chain transfer agent for use in the synthesis of the polymer particles (a-2).

The solubility parameter of the polymer particles (a-2) used for the photosensitive resin composition layer is preferably 8.0 $(cal/cm^3)^{1/2}$ or more and 11.0 $(cal/cm^3)^{1/2}$ or less, more preferably 8.5 $(cal/cm^3)^{1/2}$ or more and 10.0 $(cal/cm^3)^{1/2}$ or less, and still more preferably 8.8 $(cal/cm^3)^{1/2}$ or more and 9.5 $(cal/cm^3)^{1/2}$ or less in view of dispersibility in the photosensitive resin layer.

The solubility parameter (SP value) of the polymer particles (a-2) can be measured by the method described in the section [Solubility parameters of organic solvent and polymer gel in organic solvent-based developer].

The content of the polymer particles (a-2) in the photosensitive resin composition layer that constitutes the flexographic printing original plate is preferably 10% by mass or more and 70% by mass or less, more preferably 15% by mass or more and 60% by mass or less, and still more preferably 20% by mass or more and 50% by mass or less based on 100% by mass of the total amount of the photosensitive resin composition in view of developing performance at the time of producing a flexographic printing plate.

[Photopolymerizable Monomer (a-3)]

Examples of the photopolymerizable monomer (a-3) include, but not limited to, esters of acids such as acrylic acid, methacrylic acid, fumaric acid, and maleic acid; derivatives of acrylamides and methacrylamides; allyl esters, styrene, and derivatives thereof; and N-substituted maleimide compounds.

Specific examples of the photopolymerizable monomer (a-3) include, but not limited to, diacrylates and dimethacrylates of alkanediols such as 1,6-hexanediol and 1,9-nonanediol; or diacrylates and dimethacrylates of ethylene glycol, diethylene glycol, propylene glycol, dipropylene glycol, polyethylene glycol, butylene glycol, and dicyclopentadienyl; trimethylolpropane tri(meth)acrylate, dimethyloltricyclodecane di(meth)acrylate, isobornyl (meth)acrylate, phenoxypolyethyleneglycol (meth)acrylate, pentaerythorit tetra (meth)acrylate, N,N'-hexamethylenebisacrylamide and N,N'-hexamethylenebismethacrylamide, styrene, vinyltoluene, divinylbenzene, diacrylphthalate, triallyl cyanurate, diethyl fumarate, dibutyl fumarate, dioctyl fumarate, distearyl fumarate, butyl octyl fumarate, diphenyl fumarate, dibenzyl fumarate, dibutyl maleate, dioctyl maleate, bis(3-phenylpropyl) fumarate, dilauryl fumarate, dibehenyl fumarate, and N-lauryl maleimide.

These may be used singly, or two or more thereof may be used in combination.

The photopolymerizable monomer (a-3) is preferably a di(meth)acrylate monomer having two (meth)acrylate groups in one molecule in view of high chipping resistance at a convex part of a flexographic printing plate. The content of such a di(meth)acrylate monomer is preferably 2.0% by mass or more, more preferably 2.0 to 20% by mass, and still more preferably 5.0 to 16% by mass based on the total amount of the photosensitive resin composition.

The content of the photopolymerizable monomer (a-3) in the photosensitive resin composition layer that constitutes the flexographic printing original plate is preferably 1 to 25% by mass, more preferably 5 to 20% by mass, and still more preferably 8 to 15% by mass based on 100% by mass of the total amount of the photosensitive resin composition in view of achieving bright printing.

[Photopolymerization Initiator (a-4)]

The photopolymerization initiator (a-4) is a compound absorbing energy of light and generating a radical. Various known initiators can be used therefor, and various organic carbonyl compounds, especially aromatic carbonyl compounds are preferably used.

Examples of the photopolymerization initiator (a-4) include, but not limited to, benzophenone, 4,4-bis(diethylamino)benzophenone, t-butyl anthraquinone, 2-ethyl anthraquinone, thioxanthones such as 2,4-diethylthioxanthone, isopropylthioxanthone, and 2,4-dichlorothioxanthone; acetophenones such as diethoxyacetophenone, 2,2-dimethoxy-phenylacetophenone, 2-hydroxy-2-methyl-1-phenyl-propane-1-on, benzyl dimethyl ketal, 1-hydroxycyclohexyl-phenyl ketone, 2-methyl-2-morpholino (4-thiomethylphenyl) propane-1-on, and 2-benzyl-2-dimethylamino-1-(4-morpholinophenyl)-butanone; benzoin ethers such as benzoin methyl ether, benzoin ethyl ether, benzoin isopropyl ether, and benzoin isobutyl ether; acylphosphine oxides such as 2,4,6-trimethylbenzoyldiphenylphosphine oxide, bis(2,6-dimethoxybenzoyl)-2,4,4-trimethylpentylphosphine oxide, and bis(2,4,6-trimethylbenzoyl)-phenylphosphine oxide; methyl benzoylformate; and 1,7-bisacridinylheptane; 9-phenylacridine; and 2,6-di-t-butyl-p-cresol.

These may be used singly, or two or more thereof may be used in combination.

The content of the photopolymerization initiator (a-4) in the photosensitive resin composition layer that constitutes the flexographic printing original plate is preferably 0.1 to 10.0% by mass, more preferably 1.0 to 8.0% by mass, and still more preferably 1.5 to 5.0% by mass based on 100% by mass of the total amount of the photosensitive resin composition in view of improving plate formability at the time of producing a flexographic printing plate and in view of achieving bright printing, that is, excellent printing reproducibility in a region having a halftone area on the order of 0 to 10%.

A cleavable photopolymerization initiator and a hydrogen-drawing type photopolymerization initiator may be used in combination as the photopolymerization initiator (a-4). The content of the hydrogen-drawing type photopolymerization initiator in the photosensitive resin composition is preferably 1.0% by mass or less and more preferably 0.5% by mass or less in view of enhancing the image reproducibility and abrasion resistance of a flexographic printing plate.

[Liquid Diene (a-5)]

The photosensitive resin composition layer may contain a liquid diene (a-5).

The liquid diene (a-5) is a liquid compound having a carbon-carbon double bond.

The term "liquid" of the "liquid diene" used herein means a nature having a property of easily causing flow deformation and being able to be solidified in the deformed shape by cooling. This term corresponds to an elastomer, which has a property of being instantly deformed in response to an external force when the external force is applied, and restores the original shape in a short time when the external force is removed.

Examples of the liquid diene (a-5) include, but not limited to, liquid polybutadiene, liquid polyisoprene, a modified product of liquid polybutadiene, a modified product of liquid polyisoprene, a liquid acrylonitrile-butadiene copolymer, and a liquid styrene-butadiene copolymer. The liquid diene is a copolymer having 50% by mass or more of a diene component.

Among them, the liquid diene (a-5) is preferably liquid polybutadiene in view of the mechanical properties of the flexographic printing original plate and a flexographic printing plate obtained using this.

The number average molecular weight of the liquid diene (a-5) is not particularly limited as long as it is liquid at 20° C. The number average molecular weight is preferably 500 or more and 60000 or less, more preferably 500 or more and 50000 or less, and still more preferably 800 or more and 50000 or less in view of the wear resistance and handleability of a flexographic printing original plate obtained using the flexographic printing original plate.

The content of the liquid diene (a-5) in the photosensitive resin composition layer that constitutes the flexographic printing original plate is preferably 10 to 40% by mass, more preferably 15 to 40% by mass, and still more preferably 20 to 40% by mass based on 100% by mass of the total amount of the photosensitive resin composition layer in view of the wear resistance of the flexographic printing original plate and a flexographic printing plate obtained using this.

[Silicone Compound (a-6)]

Examples of the silicone compound (a-6) include a silicone oil, a silane coupling agent, a silane compound, silicone rubber, and a silicone resin. A silicone oil is especially preferable because the component is easily transferred to the surface to highly exhibit the effect of decreasing surface energy.

Examples of the silicone compound (a-6) include, but not limited to, a compound having a polyalkylsiloxane such as polydimethylsiloxane or polydiethylsiloxane in its main chain. The silicone compound (a-6) may be a compound having polysiloxane structure at a part of its molecular. The silicone compound (a-6) may be a compound in which a certain organic group is introduced into polysiloxane structure. Specifically, a compound in which an organic group is introduced into a side chain of polysiloxane, a compound in which an organic group is introduced into both terminals of polysiloxane, a compound in which an organic group is introduced into one terminal of polysiloxane, a compound in which an organic group is introduced into both of a side chain and a terminal of polysiloxane, and the like can be used.

Examples of the organic group to be introduced into polysiloxane structure include, but not limited to, an amino group, a carboxy group, a carbinol group, an aryl group, an alkyl group, an alkoxycarbonyl group, an alkoxy group, a linear or branched alkyl group substituted with at least one aryl group, and a polyoxyalkylene group (hereinafter also referred to as a polyether group).

Among them, the silicone compound (a-6) is more preferably a silicone oil having polysiloxane in the main skeleton and having one or more groups selected from the group consisting of an amino group, a polyether group, and a carbinol group at at least one end. Use of such a silicone compound (a-6) tends to more improve the transparency of the photosensitive resin composition layer. A commercially available product of such a silicone compound (a-6) is not particularly limited and is, for example, KF-6000 manufactured by Shin-Etsu Chemical Co., Ltd.

The content of the silicone compound (a-6) in the photosensitive resin composition layer that constitutes the flexographic printing original plate is preferably 0.1% by mass or more and 5.0% by mass or less, more preferably 0.5% by mass or more and 3.0% by mass or less, and still more preferably 0.5% by mass or more and 2.0% by mass or less based on the total amount of the photosensitive resin composition layer.

<Infrared Ablation Layer>

The flexographic printing original plate for use in the manufacturing method of a flexographic printing plate of the present embodiment has an infrared ablation layer on the photosensitive resin composition layer.

The infrared ablation layer can be subjected to lithography processing using infrared light and serves as a mask image when the photosensitive resin composition layer is exposed and cured. At the time when an unexposed part of the photosensitive resin composition layer is washed out after completion of the exposure, this infrared ablation layer is simultaneously removed.

The infrared ablation layer preferably contains a binder polymer and an infrared sensitive substance.

Examples of the binder polymer include, but not limited to, a polyamide, a polyester, and a copolymer of a monovinyl-substituted aromatic hydrocarbon and a conjugated diene. Especially, a copolymer of a monovinyl-substituted aromatic hydrocarbon such as styrene, α-methyl styrene, and vinyltoluene and a conjugated diene such as 1,3-butadiene and isoprene are preferable. When the infrared ablation layer is constituted by using such a binder polymer, compatibility with the photosensitive composition resin layer mentioned above or an optionally established intermediate layer is higher, and adhesion is thus better.

When a polyester is used as the binder polymer, the number average molecular weight of the polyester is preferably 300 or more and 10,000 or less.

The polyester is not particularly limited, and a polyester synthesized from an alkanediol and adipic acid, a polyester synthesized from an alkanediol and phthalic acid, a polycaprolactone, and two or more of these polyesters combined can be preferably used, for example.

In addition, the polyester may include various functional groups such as an amino group, a nitro group, a sulfonic acid group, and a halogen as long as they do not impair compatibility with another binder polymer, the infrared sensitive substance, and a non-infrared radiation shielding substance.

The infrared sensitive substance is not particularly limited, and a simple substance or compound having strong absorption in a range of usually 750 to 2000 nm is preferably used, for example.

Examples of the infrared sensitive substance include, but not limited to, inorganic pigments such as carbon black, graphite, copper chromite, and chromium oxide; and colorants such as a polyphthalocyanine compound, cyanine colorant, and metal thiolate colorant.

The content of such an infrared sensitive substance in the infrared ablation layer is preferably an amount such that sensitiveness for ablation with a laser beam used is imparted. The content of the infrared sensitive substance is preferably 10% by mass or more and 80% by mass or less based on the total amount of the infrared ablation layer.

A substance reflecting or absorbing radial rays such as ultraviolet light can be used as the infrared sensitive substance. Examples of such a substance include a radiation absorber such as an ultraviolet absorber, carbon black, and graphite. The amount thereof added is preferably set such that the infrared ablation layer can achieve a required optical density. It is usually preferable that the infrared sensitive substance be added such that the infrared ablation layer can achieve an optical density of two or more and preferably three or more.

<Intermediate Layer>

The flexographic printing original plate for use in the manufacturing method of a flexographic printing plate of the present embodiment may have an intermediate layer having a predetermined function between the photosensitive resin composition layer mentioned above and the infrared ablation layer mentioned later.

In order to produce a printed matter having high definition and a highlight area, a micro dot which has a flat part of a dot tip with a diameter of 10 to 20 μm and also has a relief depth of 100 μm or more is required to be formed in a flexographic printing plate. The intermediate layer is preferably an oxygen inhibiting layer having an oxygen inhibiting ability so as to achieve such a micro dot.

The intermediate layer may be an adhesive layer having an adhesive function.

When the photosensitive resin composition layer is cured by ultraviolet irradiation, curing is progressed through radical polymerization. When oxygen coexists at the time of polymerization, a radical-generating compound reacts with oxygen to suppress polymerization reaction. When an unreacted portion remains in the photosensitive resin composition layer due to suppression of polymerization reaction, the shape of a pattern finally formed has a curved portion at the tip thereof. On the other hand, when the amount of oxygen coexisting is decreased at the time of ultraviolet curing, polymerization reaction is unlikely to be suppressed, and the shape of a pattern finally formed has a flat part at the tip thereof. Accordingly, for preparing a pattern having a flat part at the tip thereof on a flexographic printing plate, it is effective to decrease oxygen contacting the photosensitive resin composition layer by imparting oxygen inhibiting ability to the intermediate layer.

In addition, the intermediate layer also has a function for protecting the infrared ablation layer.

In the manufacturing process of a conventional flexographic printing plate, the infrared ablation layer comes into contact with a roll at the time of feeding a film of the infrared ablation layer, or the infrared ablation layer and a predetermined film that protects the infrared ablation layer rub against each other due to winding constriction occurring during transportation of a film roll. These may cause brakeage of the infrared ablation layer physically, which may generate a pin hole.

The photosensitive resin composition layer and the infrared ablation layer may be stacked by a method in which the infrared ablation layer is coated with the photosensitive resin composition layer while extruding the photosensitive resin composition layer, and in such a case, a pin hole may be generated in the infrared ablation layer due to friction caused when the heated and melted photosensitive resin composition flows on the infrared ablation layer.

In order to prevent such generation of a pin hole in the infrared ablation layer, the intermediate layer included in the flexographic printing original plate preferably has physical strength and heat resistance.

As described above, in order to produce a printed matter having high definition and a highlight area, a micro dot in which a flat part of the dot tip of the flexographic printing plate has a diameter of 10 to 20 μm is required to be formed; therefore, if a mask image for forming micro dots overlaps the periphery of a pin hole of 20 μm or more in the infrared ablation layer, dot formation failure may occur to result in failure in production of a flexographic printing plate having high definition and a highlight area.

From such a viewpoint, the intermediate layer is preferably an oxygen inhibiting layer having an oxygen inhibiting ability and preferably has physical strength and heat resistance, as described above.

Furthermore, it is preferable that the intermediate layer can be cleaned with the same cleaning liquid as that for the infrared ablation layer and the photosensitive resin composition layer in view of simplicity of manufacturing process of a flexographic printing plate.

When the intermediate layer has high cleanability, time required for a cleaning step can be shortened, workability improves, and the photosensitive resin composition layer located below the intermediate layer can be easily developed.

Examples of material preferably used for the intermediate layer include, but not limited to, polymers such as an ethylene-vinyl alcohol copolymer, polyvinyl alcohol, polyvinyl acetate, polyvinyl butyral, polyvinylpyrrolidone, polyvinyl chloride, polyvinylidene chloride, polyvinyl fluoride, polyvinylidene fluoride, polyacrylonitrile, polymethyl methacrylate, polyacetal, polycarbonate, polystyrene, polycarbonate, polyethylene, polypropylene, a cellulose derivative, polyester, polyamide, polyimide, polyurethane, silicone rubber, butyl rubber, and isoprene rubber.

The intermediate layer preferably contains water-dispersion latex.

Examples of the water-dispersion latex include, but not limited to, a latex polymer dispersed in water, such as polybutadiene latex, natural rubber latex, styrene-butadiene copolymer latex, acrylonitrile-butadiene copolymer latex, polyvinylidene chloride latex, polychloroprene latex, polyisoprene latex, polyurethane latex, methacrylate methylbutadiene copolymer latex, vinylpyridine polymer latex, butyl polymer latex, Thiokol polymer latex, and acrylate polymer latex; and a latex copolymer in which another component such as acrylic acid and methacrylic acid is copolymerized with these polymers.

These polymers may be used singly, or two or more thereof may be used in combination.

The intermediate layer may be supplemented with other components, for example, a surfactant, an antiblocking agent, a mold release agent, a UV absorber, a dye, and a pigment.

The thickness of the intermediate layer is preferably 0.5 μm or more and 20 μm or less. When the thickness is 0.5 μm or more, sufficient film strength is obtained. When the thickness is 20 μm or less, sufficient cleanability can be obtained. The thickness of the intermediate layer is more preferably 0.5 μm or more and 10 μm or less and still more preferably 0.5 μm or more and 5 μm or less.

[Flexographic Printing Plate and Printing Method]

The flexographic printing plate obtained by the manufacturing method of a flexographic printing plate of the present embodiment has a support and a cured photosensitive resin composition layer in which an arbitrary concave-convex pattern is formed by relief exposure.

Ink adheres to the top parts of the photosensitive resin composition layer during printing, and the ink on the top parts adheres to an object to be printed to carry out flexographic printing.

The printing method of the present embodiment includes the step of obtaining a flexographic printing plate by the above-described manufacturing method of a flexographic printing plate of the present embodiment, and the step of performing printing using the flexographic printing plate.

EXAMPLES

Hereinafter, the present embodiment will be described in more detail by way of specific Examples and Comparative Examples. However, the present invention is not limited by the following Examples and Comparative Examples by any means.

[Examples 1 to 16] and [Comparative Examples 1 to 5]

Manufacturing methods of flexographic printing plates of Examples 1 to 16 and Comparative Examples 1 to 5 will be described below.

((1) Manufacturing of Polymer Gel/Polymer Particles)

A polymer gel to be added to an organic solvent-based developer and polymer particles to be added to a photosensitive resin composition layer for use in the manufacturing process of a flexographic printing plate were produced as follows.

The "polymer gel" and the "polymer particles" in polymer gel/polymer particles A to E described below were distinguished from each other as a polymer gel to be contained in the organic solvent-based developer and polymer particles to be contained in the photosensitive resin composition layer, respectively, and were the same in terms of materials.

<Manufacturing of Polymer Gel/Polymer Particles A>

To a pressure resistant reaction vessel provided with a stirring device and a jacket for temperature adjustment were initially added 125 parts by mass of water and, as a reactive emulsifier, 2 parts by mass of "ADEKA REASOAP" (manufactured by ADEKA Corp.), an ammonium salt of α-sulfo (1-nonylphenoxy)methyl-2-(2-propenyloxy) ethoxy-poly(oxy-1,2-ethanediyl). The inside temperature was increased to 80° C.; and an oil-based mixture liquid including 2 parts by mass of t-dodecyl mercaptan and a monomer mixture including 10 parts by mass of styrene, 60 parts by mass of butadiene, 23 parts by mass of butyl acrylate, 5 parts by mass of methacrylic acid, and 2 parts by mass of acrylic acid, and an aqueous solution including 28 parts by mass of water, 1.2 parts by mass of sodium peroxodisulfate, and 0.2 parts by mass of sodium hydroxide, and 2 parts by mass of an ammonium salt of α-sulfo (1-nonylphenoxy)methyl-2-(2-propenyloxy) ethoxy-poly(oxy-1,2-ethanediyl) were added to the reaction vessel over five hours and six hours, respectively, at a constant flow rate.

Subsequently, the temperature was continuously kept at 80° C. for one hour to complete polymerization reaction and obtain a copolymer latex, followed by cooling.

Furthermore, pH of the produced copolymer latex was adjusted to 7 with sodium hydroxide, unreacted monomers were then removed by a steam stripping method followed by filtration with a 200 mesh metallic mesh, and the solid concentration of the filtrate was finally adjusted to 40% by mass to obtain an aqueous dispersion of a polymer gel.

The obtained aqueous dispersion of the polymer gel was dried up by a vacuum dryer at 50° C. to consequently remove water therefrom to thereby obtain polymer gel/polymer particles A.

The polymer particles of the polymer gel/polymer particles A had a number average particle diameter of 66 nm and a toluene gel fraction of 99%.

The number average particle diameter of the polymer gel/polymer particles in a dispersed state in a developer was measured using dynamic light scattering particle diameter/particle size distribution measurement apparatus Microtrac (manufactured by Nikkiso Co., Ltd.).

The solubility parameter (SP value) of the polymer gel/polymer particles was determined by use of the cloud-point titration method.

Specifically, after the polymer gel/polymer particles were dispersed in a good solvent (hexane), a poor solvent (ethanol) was dropped thereto until separation or precipitation occurred. The SP value (δ) was determined by applying the volume of the dropped poor solvent to the following expression (2):

$$SP\ \text{value}(\delta)=(V_{m1}^{1/2}\cdot\delta_{m1}+V_{mh}^{1/2}\cdot\delta_{mh})/(V_{m1}^{1/2}+V_{mh}^{1/2}) \quad (2)$$

wherein $V_{m1}$ represents the volume of the poor solvent having a lower SP value, $V_{mh}$ represents the volume of the poor solvent having a higher SP value, $\delta_{m1}$ represents the SP value of the poor solvent having a lower SP value, and $\delta_{mh}$ represents the SP value of the poor solvent having a higher SP value.

The SP value was calculated using good solvents and poor solvents given below and their respective SP values. SP values in the description below were also calculated in the same manner as above.

Good solvent:
Toluene (SP value: 8.9 [$(cal/cm^3)^{1/2}$])
p-Xylene (SP value: 8.7 [$(cal/cm^3)^{1/2}$])
Butyl acetate (SP value: 8.5 [$(cal/cm^3)^{1/2}$])
Ethyl acetate (SP value: 9.1 [$(cal/cm^3)^{1/2}$])
Acetone (SP value: 9.8 [$(cal/cm^3)^{1/2}$])
Poor solvent:
n-Hexane (SP value: 7.2 [$(cal/cm^3)^{1/2}$])
Ethanol (SP value: 12.9 [$(cal/cm^3)^{1/2}$])
Water (SP value: 23.4 [$(cal/cm^3)^{1/2}$])

<Manufacturing of Polymer Gel/Polymer Particles B>

Polymer gel/polymer particles B were obtained in the same manner as for the polymer gel/polymer particles A except that the polymerization reaction temperature condition was changed to 95° C.

The polymer gel/polymer particles B had a number average particle diameter of 40 nm and a toluene gel fraction of 98%.

The SP value was measured in the same manner as for the polymer gel/polymer particles A.

<Manufacturing of Polymer Gel/Polymer Particles C>

Polymer gel/polymer particles C were obtained in the same manner as for the polymer gel/polymer particles A except that the polymerization reaction temperature condition was changed to 90° C.

The polymer gel/polymer particles C had a number average particle diameter of 58 nm and a toluene gel fraction of 99%.

The SP value was measured in the same manner as for the polymer gel/polymer particles A.

<Manufacturing of Polymer Gel/Polymer Particles D>

Polymer gel/polymer particles D were obtained in the same manner as in the polymer gel/polymer particles A except that the polymerization reaction temperature condition was changed to 70° C.; and the amount of "ADEKA REASOAP" (manufactured by ADEKA Corp.), an ammonium salt of α-sulfo (1-nonylphenoxy)methyl-2-(2-propenyloxy) ethoxy-poly(oxy-1,2-ethanediyl), added was changed to 1.8 parts by mass.

The polymer gel/polymer particles D had a number average particle diameter of 318 nm and a toluene gel fraction of 95%.

The SP value was measured in the same manner as for the polymer gel/polymer particles A.

<Manufacturing of Polymer Gel/Polymer Particles E>

Polymer gel/polymer particles E were obtained in the same manner as in the polymer gel/polymer particles A except that the polymerization reaction temperature condition was changed to 65° C.; and the amount of "ADEKA REASOAP" (manufactured by ADEKA Corp.), an ammonium salt of α-sulfo (1-nonylphenoxy)methyl-2-(2-propenyloxy) ethoxy-poly (oxy-1,2-ethanediyl), added was changed to 1.6 parts by mass.

The polymer gel/polymer particles E had a number average particle diameter of 405 nm and a toluene gel fraction of 97%.

The SP value was measured in the same manner as for the polymer gel/polymer particles A.

((2) Production of Base Film (Support) Having Adhesive Layer)

55 parts by mass of Tufprene 912 (manufactured by Asahi Kasei Corp., trade name), which is a block copolymer of styrene and 1,3-butadiene, 38 parts by mass of paraffin oil (average carbon number: 33, average molecular weight: 470, and density at 15° C.: 0.868), 2.5 parts by mass of 1,9-nonanediol diacrylate, 1.5 parts by mass of 2,2-dimethoxy-phenylacetophenone, 3 parts by mass of EPOXY ESTER 3000M (manufactured by Kyoeisha Chemical Co., Ltd., trade name), and 1.5 parts by mass of VALIFAST YELLOW-3150 (manufactured by ORIENT CHEMICAL INDUSTRIES CO., LTD., trade name) were dissolved in toluene to obtain a solution with a solid content of 25%, as a solution for an adhesive layer to be applied to a base film (support).

Thereafter, the solution was applied to one side of a polyester film having a thickness of 100 μm using a knife coater so as to achieve an ultraviolet transmittance of 10%, followed by drying at 80° C. for one minute, to obtain a base film (support) having an adhesive layer.

The ultraviolet transmittance of the support was calculated from transmission intensity measured by UV illuminometer MO-2 model (manufactured by ORC MANUFACTURING CO., LTD., trade name, UV-35 filter) using ultraviolet light exposure apparatus AFP-1500 (manufactured by Asahi Kasei Corp., trade name).

((3) Production of Film Having Infrared Ablation Layer)

After 65% by mass of Asaflex 810 (manufactured by Asahi Kasei Corp., trade name), which is a block copolymer of styrene and 1,3-butadiene, and 35% by mass of carbon black as an infrared sensitive substance were kneaded with a kneader and cut into a pellet, 90 parts by mass of this pellet and 10 parts by mass of 1,6-hexanediol adipate were dissolved, by ultrasonication, in a solvent mixture prepared at a mass ratio of ethyl acetate/butyl acetate/propyleneglycol monomethyl ether acetate=50/30/20 to prepare a uniform solution with a solid content of 12% by mass.

Thereafter, the solution was applied onto a polyester film to be a cover sheet with a thickness of 100 μm to achieve an amount of the coating after drying of 4 to 5 g/m² using a knife coater, followed by drying at 80° C. for one minute, to obtain a film having an ultraviolet shielding layer (infrared ablation layer) capable of ablating by infrared light.

The optical density of the film having the infrared ablation layer measured by DM-500 (manufactured by SCREEN Holdings Co., Ltd., trade name) was 3 to 4.

((4) Production of Flexographic Printing Original Plate)

<Production of Flexographic Printing Original Plate 1>

32 parts by mass of the polymer gel/polymer particles A (which were used as the polymer particles A) obtained in (1) described above and 28 parts by mass of a styrene-butadiene-styrene copolymer having a styrene ratio of 24% by mass [D-KX405: manufactured by Kraton Corp.] were mixed at 140° C. using a pressure kneader.

Thereafter, a liquid mixture of 32 parts by mass of a liquid polybutadiene [LBR-352: manufactured by Kuraray Co., Ltd.], 8 parts by mass of 1,9-nonanediol diacrylate, 5 parts by mass of 1,6-hexanediol dimethacrylate, 2 parts by mass of 2,2-dimethoxy-phenylacetophenone, 1 part by mass of 2,6-di-t-butyl-p-cresol, and 1 part by mass of carbinol-modified silicone oil [KF-6000: manufactured by Shin-Etsu Chemical Co., Ltd.] was added little by little over 15 minutes, and additional kneading was carried out for 20 minutes to obtain a photosensitive resin composition.

Thereafter, the photosensitive resin composition was put into an extrusion molding machine, and extruded and molded from a T-shaped die, and on a face of the resulting photosensitive resin composition layer, the base film (support) having the adhesive layer obtained in (2) described above was laminated so that the adhesive layer contacted the photosensitive resin composition layer. A mold release film (manufactured by Mitsubishi Chemical Corp., DIAFOIL MRV100) was further laminated on the face of the photosensitive resin composition layer opposed from the side on which the support was laminated, to obtain a stack of the support and the photosensitive resin composition layer.

Thereafter, the mold release film was peeled, and the cover film having the infrared ablation layer obtained in (3) described above was laminated so that the infrared ablation layer contacted the photosensitive resin composition layer to obtain a flexographic printing original plate.

<Production of Flexographic Printing Original Plates 2 to 7>

Flexographic printing original plates 2 to 7 were obtained in the same manner as for the flexographic printing original plate 1 except that the types of the polymer particles and the thermoplastic elastomer in the photosensitive resin composition layer used were changed as shown in Tables 1 to 3 below. The materials used in the production of the flexographic printing original plates are shown in Table 1 to 3 below.

The symbols of the thermoplastic elastomers in the tables will be given below.

[Thermoplastic Elastomer Used]

KX405: D-KX405, manufactured by Kraton Corp. (SP value: 9.0)

Tufprene 315: (manufactured by Asahi Kasei Corp., styrene ratio: 20% by mass) (SP value: 9.1)

Asaprene 420P: (manufactured by Asahi Kasei Corp., trade name) (SP value: 9.3)

<Production of Flexographic Printing Original Plate 8>

After mixing 60 parts by mass of a styrene-butadiene-styrene copolymer "Asaprene 420P" (manufactured by Asahi Kasei Corp., trade name) having a styrene ratio of 30% by mass at 140° C. using a pressure kneader, a liquid mixture of 32 parts by mass of a liquid polybutadiene [LBR-352: manufactured by Kuraray Co., Ltd.], 8 parts by mass of 1,9-nonanediol diacrylate, 5 parts by mass of 1,6-hexanediol dimethacrylate, 2 parts by mass of 2,2- dimethoxy-phenylacetophenone, 1 part by mass of 2,6-di-t-butyl-p-cresol, and 1 part by mass of carbinol-modified silicone oil [KF-6000: manufactured by Shin-Etsu Chemical Co., Ltd.] was added little by little over 15 minutes, and additional kneading was carried out for 20 minutes to obtain a photosensitive resin composition.

The subsequent steps were performed in the same manner as for the flexographic printing original plate 1 to obtain flexographic printing original plate 8.

The materials used in the production of the flexographic printing original plate are shown in Table 1 to 3 below.

(Patten Exposure)

The cover sheet of the infrared ablation layer was peeled, a concave line with a width of 100 μm was drawn on the infrared ablation layer using a laser ablation device (CDI) manufactured by ESKO, and the infrared ablation layer side was then exposed at 8000 mJ under an air atmosphere using the above-described exposure apparatus.

Thereafter, the flexographic printing original plate was exposed using a LED exposure apparatus (XPS) manufactured by ESKO such that a pattern height (RD) after curing was on the order of 0.6 mm.

(Development of Flexographic Printing Original Plate)

Thereafter, development was performed by the following method.

In Examples and Comparative Examples, a predetermined flexographic printing original plate was developed using a predetermined developer as shown in Tables 1 to 3 below.

When the developer contained a polymer gel, a developer supplemented with predetermined polymer gel/polymer particles (which were used as the polymer gel) shown in Tables 1 to 3 below at the content shown in Tables 1 to 3 below was used.

When the developer contained no polymer gel, the term "None" was described in the tables.

A double faced tape was attached to a rotating drum of "AFP-1500" developing apparatus (manufactured by Asahi Kasei Corp., trade name), followed by fixation, development at a liquid temperature of 25° C., and drying at 60° C. for 90 minutes.

<Type of Developer>
  "Cylosol" (manufactured by DuPont Specialty Products K.K., trade name) (SP value: 9.4)
  "SOLVIT" (manufactured by MacDermid Performance Solutions Japan K.K., trade name) (SP value: 10.0)
  3-Methoxybutyl acetate (SP value: 9.1)
  1-Propanol (SP value: 12.8)
  Pure water <Type of Polymer Gel or Particles to be Contained in Developer>
  Polymer gels A to E produced as described above
  MEK-AC-5140Z: (silica, number average particle diameter: 85 nm, manufactured by Nissan Chemical Corp.)
  Fine Sphere FS102: (styrene-acrylic particles, toluene gel fraction: 0%, number average particle diameter: 80 nm, manufactured by Nippon Paint Co., Ltd.)

The number average particle diameter of Fine Sphere FS102 was a particle diameter before addition to the developer.

(Post Treatment)

In order to remove tackiness on the surface, the entire surface of the dried flexographic printing original plate was exposed to light (2000 mJ/cm$^2$) by irradiation with a sterilization lamp (manufactured by Toshiba Lighting & Technology Corp., GL-30, trade name) having 254 nm as a central wavelength using AFP-1216LF (manufactured by Asahi Kasei Corp., trade name), to obtain a flexographic printing plate.

The postexposure dose with the sterilization lamp here was calculated from an illuminance measured using a UV-25 filter of the apparatus "UV-MO2".

[Measurement and Calculation Methods for Various Physical Property Values]

(Absolute Value of Difference Between SP Value of Solvent in Developer and SP Value of Polymer Gel)

The absolute value of difference was calculated from the SP values of the solvents described in <Type of developer> described above and the SP value of the polymer gel or particles shown in Tables 1 to 3.

(Presence or Absence of Phase Separated Structure Between Thermoplastic Elastomer and Polymer Particles)

The phase separation was examined using AFM.

(Absolute Value of Difference Between SP Value of Thermoplastic Elastomer and SP Value of Polymer Particles)

The absolute value of difference was calculated from the respective SP values described in [Thermoplastic elastomer used] described above and the SP value of the polymer gel or particles shown in Tables 1 to 3.

[Evaluation of Developing Characteristics]

<Evaluation of Developing Rate>

For the unexposed part of the flexographic printing original plate, the average thickness of development was calculated from plate thicknesses before and after development, and a time taken to develop relief depth (RD): 0.6 mm was calculated from the average thickness of development and regarded as a developing time.

5: The developing time is less than 3 minutes
  4: The developing time is 3 minutes or more and less than 5 minutes
  3: The developing time is 5 minutes or more and less than 7 minutes
  2: The developing time is 7 minutes or more and less than 10 minutes
  1: The developing time is 10 minutes or more

[Evaluation of Flexographic Printing Plate]

Plate evaluation was conducted on the flexographic printing plate.

<Evaluation of Dimensional Stability>

Thickness measurement was performed for the relief surface of a 600 mm×600 mm flexographic printing plate while the measurement position was changed by about 150 mm in the longitudinal direction and/or in the transverse direction from the end part of the flexographic printing plate. Thicknesses at a total of 16 locations were measured, and standard deviation was calculated. The evaluation scale was shown below.

It was determined that in the following evaluation scale, those given a score of 3 or more were practically usable without any problem.

[Evaluation Scale]
  5: Three times the standard deviation of the thicknesses at 10 locations are less than 6
  4: Three times the standard deviation of the thicknesses at 10 locations are 6 or more and less than 9
  3: Three times the standard deviation of the thicknesses at 10 locations are 9 or more and less than 12
  2: Three times the standard deviation of the thicknesses at 10 locations are 12 or more and less than
  1: Three times the standard deviation of the thicknesses at 10 locations are 15 or more <Evaluation of Depth of Outline in White>

The depth of the concave line with a width of 100 μm in the flexographic printing plate was measured.

In the evaluation, it was considered that a larger depth of the concave line was more favorable for maintaining excellent printing quality for a long time.

It was determined that in the following evaluation scale, those given a score of 3 or more were practically usable without any problem.

[Evaluation Scale]
5: The depth of the concave line is 60 μm or more
4: The depth of the concave line is 55 μm or more and less than 60 μm
3: The depth of the concave line is 50 μm or more and less than 55 μm
2: The depth of the concave line is 45 μm or more and less than 50 μm
1: The depth of the concave line is less than 45 μm

TABLE 1

|  | Example 1 | Example 2 | Example 3 | Example 4 | Example 5 | Example 6 | Example 7 | Example 8 |
|---|---|---|---|---|---|---|---|---|
| Type of developer | Cylosol | Cylosol | Cylosol | Cylosol | Cylosol | SOLVIT | Cylosol | Cylosol |
| SP value of developer (cal/cm3) | 9.4 | 9.4 | 9.4 | 9.4 | 9.4 | 10.0 | 9.4 | 9.4 |
| Polymer gel or particles added to developer | A | A | A | A | A | A | B | C |
| SP value of polymer gel or particles (cal/cm3) | 8.6 | 8.6 | 8.6 | 8.6 | 8.6 | 8.6 | 8.6 | 8.6 |
| Amount of polymer gel or particles in developer (% by mass) | 1.0 | 0.1 | 0.5 | 5.0 | 10.0 | 1.0 | 1.0 | 1.0 |
| Absolute value of difference between SP value of solvent in developer and SP value of polymer gel (cal/cm3) 1/2 | 0.8 | 0.8 | 0.8 | 0.8 | 0.8 | 1.5 | 0.8 | 0.8 |
| Number average particle diameter of polymer gel or particles (nm) | 66 | 66 | 66 | 66 | 66 | 66 | 40 | 58 |
| Flexographic printing original plate | 1 | 1 | 1 | 1 | 1 | 1 | 2 | 3 |
| Thermoplastic elastomer in photosensitive resin composition layer | KX405 | KX405 | KX405 | KX405 | KX405 | KX405 | KX405 | KX405 |
| Polymer particles in photosensitive resin composition layer | A | A | A | A | A | A | B | C |
| Phase separated structure between thermoplastic elastomer and polymer particles | Present | Present | Present | Present | Present | Present | Present | Present |
| Absolute value of difference between SP value of thermoplastic elastomer and SP value of polymer particles (cal/cm3) 1/2 | 0.4 | 0.4 | 0.4 | 0.4 | 0.4 | 0.4 | 0.4 | 0.4 |
| Developing rate | 5 | 4 | 5 | 5 | 4 | 5 | 4 | 5 |
| Dimensional stability | 5 | 4 | 5 | 5 | 5 | 5 | 5 | 5 |
| Depth of outline in white | 5 | 5 | 5 | 5 | 5 | 5 | 5 | 5 |

TABLE 2

|  | Example 9 | Example 10 | Example 11 | Example 12 | Example 13 | Example 14 | Example 15 | Example 16 |
|---|---|---|---|---|---|---|---|---|
| Type of developer | Cylosol | Cylosol | 3-Methoxybutyl acetate | 1-Propanol | 1-Propanol | 1-Propanol | 1-Propanol | 1-Propanol |
| SP value of developer (cal/cm3) | 9.4 | 9.4 | 9.1 | 12.8 | 12.8 | 12.8 | 12.8 | 12.8 |
| Polymer gel or particles added to developer | D | E | A | A | A | A | A | A |
| SP value of polymer gel or particles (cal/cm3) | 8.6 | 8.6 | 8.6 | 8.6 | 8.6 | 8.6 | 8.6 | 8.6 |
| Amount of polymer gel or particles in developer (% by mass) | 1.0 | 1.0 | 1.0 | 1.0 | 1.0 | 1.0 | 1.0 | 1.0 |
| Absolute value of difference between SP value of solvent in developer and SP value of polymer gel (cal/cm3) 1/2 | 0.8 | 0.8 | 0.5 | 4.2 | 4.2 | 4.2 | 4.2 | 4.2 |
| Number average particle diameter of polymer gel or particles (nm) | 318 | 405 | 66 | 66 | 66 | 66 | 66 | 318 |
| Flexographic printing original plate | 4 | 5 | 1 | 1 | 6 | 7 | 8 | 7 |
| Thermoplastic elastomer in photosensitive resin composition layer | KX405 | KX405 | KX405 | KX405 | Tufprene 315 | Asaprene 420P | Asaprene 420P | Asaprene 420P |
| Polymer particles in photosensitive resin composition layer | D | E | A | A | A | A | None | D |
| Phase separated structure between thermoplastic elastomer and polymer particles | Present | Present | Present | Present | Present | Present | Absent | Present |

TABLE 2-continued

|  | Example 9 | Example 10 | Example 11 | Example 12 | Example 13 | Example 14 | Example 15 | Example 16 |
|---|---|---|---|---|---|---|---|---|
| Absolute value of difference between SP value of thermoplastic elastomer and SP value of polymer particles (cal/cm3) 1/2 | 0.4 | 0.4 | 0.4 | 0.4 | 0.5 | 0.7 | — | 0.7 |
| Developing rate | 5 | 5 | 4 | 4 | 4 | 4 | 3 | 4 |
| Dimensional stability | 5 | 5 | 4 | 4 | 4 | 4 | 3 | 4 |
| Depth of outline in white | 4 | 3 | 5 | 4 | 4 | 4 | 3 | 4 |

TABLE 3

|  | Comparative Example 1 | Comparative Example 2 | Comparative Example 3 | Comparative Example 4 | Comparative Example 5 |
|---|---|---|---|---|---|
| Type of developer | Cylosol | Cylosol | Pure water | Cylosol | Cylosol |
| SP value of developer (cal/cm3) | 9.4 | 9.4 | 23.4 | 9.4 | 9.4 |
| Polymer gel or particles added to developer | None | A | A | MEK-AC-5410Z | Fine Sphere FS102 |
| SP value of polymer gel or particles (cal/cm3) | — | 8.6 | 8.6 | — | 3.9 |
| Amount of polymer gel or particles in developer (% by mass) | 0.0 | 15.0 | 1.0 | 1.0 | 1.0 |
| Absolute value of difference between SP value of solvent in developer and SP value of polymer gel (cal/cm3) 1/2 | — | 0.8 | 14.8 | — | 0.5 |
| Number average particle diameter of polymer gel or particles (nm) | — | 66 | 66 | 85 | 80* |
| Flexographic printing original plate | 8 | 1 | 1 | 8 | 8 |
| Thermoplastic elastomer in photosensitive resin composition layer | Asaprene 420P | KX405 | KX405 | Asaprene 420P | Asaprene 420P |
| Polymer particles in photosensitive resin composition layer | None | A | A | None | None |
| Phase separated structure between thermoplastic elastomer and polymer particles | Absent | Present | Present | Absent | Absent |
| Absolute value of difference between SP value of thermoplastic elastomer and SP value of polymer particles (cal/cm3) 1/2 | — | 0.4 | 0.4 | — | — |
| Developing rate | 2 | 2 | 1 | 3 | 1 |
| Dimensional stability | 2 | 3 | 4 | 1 | 2 |
| Depth of outline in white | 3 | 2 | 1 | 3 | 2 |

INDUSTRIAL APPLICABILITY

The manufacturing method of a flexographic printing plate of the present invention has industrial applicability in a wide range of general commercial printing fields.

The invention claimed is:

1. A manufacturing method of a flexographic printing plate, comprising developing by subjecting a plate surface of a flexographic printing original plate comprising at least a support, a photosensitive resin composition layer, and an infrared ablation layer sequentially stacked to brushing with a brush while supplying an organic solvent-based developer to the plate surface, wherein the organic solvent-based developer comprises a polymer gel, the polymer gel is constituted of a polymer, the polymer gel is present in a state dispersed in the organic solvent-based developer without being dissolved in the organic solvent-based developer, the polymer gel is a particle having a number average particle diameter measured in a dispersed state in a developer of 40 nm or more and 400 nm or less, the organic solvent-based developer comprises 0.1% by mass or more and 10.0% by mass or less of a polymer gel, and a content of the polymer gel is a ratio of a mass of the polymer gel that does not contain the organic solvent-based developer solution inside based on a total amount of the organic solvent-based developer.

2. The manufacturing method of the flexographic printing plate according to claim 1, wherein an absolute value of difference between a solubility parameter (SP value) of the organic solvent and a solubility parameter (SP value) of the polymer gel in the organic solvent-based developer is 0.5 $(cal/cm^3)^{1/2}$ or more and 4.0 $(cal/cm^3)^{1/2}$ or less.

3. The manufacturing method of the flexographic printing plate according to claim 1, wherein the photosensitive resin composition layer comprises a thermoplastic elastomer.

4. The manufacturing method of the flexographic printing plate according to claim 1, wherein the photosensitive resin composition layer comprises a thermoplastic elastomer and a polymer particle.

5. The manufacturing method of the flexographic printing plate according to claim 4, wherein the photosensitive resin composition layer has a dispersed phase and a continuous phase, and the thermoplastic elastomer and the polymer particle form the continuous phase and the dispersed phase, respectively.

6. The manufacturing method of the flexographic printing plate according to claim 4, wherein
an absolute value of difference between a solubility parameter (SP value) of the thermoplastic elastomer and a solubility parameter (SP value) of the polymer particle is
0.1 $(cal/cm^3)^{1/2}$ or more and 2.0 $(cal/cm^3)^{1/2}$ or less.

7. The manufacturing method of the flexographic printing plate according to claim 1, wherein
the organic solvent-based developer comprises
one or more selected from the group consisting of fatty acid esters, hydrocarbons, and chlorine-based organic solvents; and
an alcohol.

8. A printing method comprising:
obtaining a flexographic printing plate by the manufacturing method of the flexographic printing plate according to claim 1, and
performing printing using the flexographic printing plate.

* * * * *